(12) United States Patent
Wang (10) Patent No.: US 10,453,872 B1
(45) Date of Patent: Oct. 22, 2019

(54) ARRAY SUBSTRATE AND MANUFACTURING METHOD THEREOF

(71) Applicant: WUHAN CHINA STAR OPTOELECTRONICS SEMICONDUCTOR DISPLAY TECHNOLOGY CO., LTD., Wuhan, Hubei (CN)

(72) Inventor: Xing Wang, Hubei (CN)

(73) Assignee: WUHAN CHINA STAR OPTOELECTRONICS SEMICONDUCTOR DISPLAY TECHNOLOGIY CO., LTD., Wuhan (CN)

( * ) Notice: Subject to any disclaimer, the term of this patent is extended or adjusted under 35 U.S.C. 154(b) by 0 days.

(21) Appl. No.: 16/085,599

(22) PCT Filed: Aug. 9, 2018

(86) PCT No.: PCT/CN2018/099633
§ 371 (c)(1),
(2) Date: Sep. 17, 2018

(30) Foreign Application Priority Data

May 3, 2018 (CN) .......................... 2018 1 0434245

(51) Int. Cl.
*H01L 27/12* (2006.01)
*H01L 27/32* (2006.01)
*H01L 51/00* (2006.01)

(52) U.S. Cl.
CPC ...... *H01L 27/1248* (2013.01); *H01L 27/1218* (2013.01); *H01L 27/1288* (2013.01); *H01L 27/124* (2013.01); *H01L 27/3244* (2013.01); *H01L 51/0097* (2013.01)

(58) Field of Classification Search
CPC ............. H01L 27/1248; H01L 27/1288; H01L 27/1218; H01L 51/0097; H01L 27/124; H01L 27/3244
See application file for complete search history.

(56) References Cited

U.S. PATENT DOCUMENTS

| | | | |
|---|---|---|---|
| 5,296,716 A * | 3/1994 | Ovshinsky | G11C 11/56 257/3 |
| 6,682,963 B2 * | 1/2004 | Ishikawa | G02F 1/1368 257/347 |
| 7,049,215 B2 | 5/2006 | Lai | |
| 7,524,689 B2 * | 4/2009 | Kato | G02F 1/13454 438/30 |
| 7,667,276 B2 * | 2/2010 | Ohmi | H01L 21/8221 257/347 |
| 7,736,964 B2 * | 6/2010 | Yamamoto | H01L 21/02532 257/4 |
| 7,816,721 B2 * | 10/2010 | Yamazaki | B82Y 10/00 257/306 |

(Continued)

FOREIGN PATENT DOCUMENTS

| | | |
|---|---|---|
| CN | 105371253 A | 2/2017 |
| CN | 107680974 A | 2/2018 |
| CN | 107910335 A | 4/2018 |

*Primary Examiner* — John P. Dulka
(74) *Attorney, Agent, or Firm* — Mark M. Friedman (57) ABSTRACT

An array substrate and a manufacturing method of a flexible display device utilizes a first source/drain electrode and a second source/drain electrode disposed on an array substrate to connect with each other through a first via hole.

13 Claims, 5 Drawing Sheets

(56) References Cited

U.S. PATENT DOCUMENTS

| | | | | |
|---|---|---|---|---|
| 8,110,442 B2* | 2/2012 | Jinbo | ............ | H01L 27/1266 |
| | | | | 438/114 |
| 8,232,621 B2* | 7/2012 | Yamazaki | ........ | G06K 19/07749 |
| | | | | 257/277 |
| 8,492,246 B2* | 7/2013 | Dairiki | ............ | H01L 27/1214 |
| | | | | 438/460 |
| 8,508,027 B2* | 8/2013 | Takahashi | ......... | H01L 23/49855 |
| | | | | 257/678 |
| 8,835,907 B2* | 9/2014 | Moriya | ............ | H01L 21/56 |
| | | | | 257/40 |
| 9,780,121 B2* | 10/2017 | Watanabe | ............ | H01L 27/1225 |
| 9,997,568 B2* | 6/2018 | Yamazaki | ............ | B82Y 10/00 |
| 2002/0094639 A1* | 7/2002 | Reddy | ............ | G06K 19/07749 |
| | | | | 438/257 |
| 2003/0151360 A1* | 8/2003 | Fukunaga | ............ | H01L 51/0097 |
| | | | | 313/506 |
| 2004/0164302 A1* | 8/2004 | Arai | ............ | G06K 19/07749 |
| | | | | 257/72 |
| 2018/0217458 A1 | 8/2018 | Xie | | |
| 2019/0165072 A1* | 5/2019 | Wang | ............ | H01L 27/3265 |

* cited by examiner

ARRAY SUBSTRATE AND MANUFACTURING METHOD THEREOF

CROSS REFERENCE TO RELATED APPLICATIONS

This application is a U.S. National Phase application submitted under 35 U.S.C. § 371 of Patent Cooperation Treaty Application serial No. PCT/CN2018/099633, filed Aug. 9, 2018, which claims the priority of China Patent Application serial No. 201810434245.3, filed May 3, 2018, the disclosures of which are incorporated herein by reference in their entirety.

BACKGROUND OF INVENTION

1. Field of Invention

The present invention relates to a flat panel display field, and particularly to an array substrate and a manufacturing method thereof.

2. Related Art

Low temperature poly-silicon (LTPS) has become a powerful technology in the liquid crystal display field because it has high electron mobility capable of efficiently reducing size of thin film transistor devices, increasing pixel aperture ratio and display brightness of panels, to reduce overall power consumption and to significantly lower panel manufacturing costs.

With evolutionary development of display technology, research and development personnel have developed flexible display devices which are foldable and rollable. In comparison with conventional rigid display devices (i.e., display devices manufactured on inflexible substrates, such as glass substrates), flexible display devices have many advantages, such as light weight, less volume, more convenient to carry, higher impact resistance, and greater shock resistance performance. With continuous development of display technology, flexible display devices are more applicable to curved surface displays and wearable displays because of its flexible and bendable features, and therefore have gained wide attention in display fields in recent years.

Currently, flexible display devices are mainly driven by active matrix LTPS thin film transistors. In order to meet increase in display area requirements, lower frames need to be narrower and bending resistant, which result in technical problems of signal delay and abnormal display screen occurring in many display panels. The present invention is thus to provide following solutions to overcome the above-mentioned technical problem.

SUMMARY OF INVENTION

Accordingly, an object of the present invention is to provide an array substrate and a manufacturing method thereof, in order to overcome the technical problem of signal delay and abnormal display screen occurred in display panels.

To achieve the above mentioned object, the present invention provides an array substrate, wherein the array substrate comprises a substrate; a first source/drain electrode formed on the substrate; a first insulating layer formed on the first source/drain electrode; an active layer formed on the first insulating layer, the active layer comprising a doped region doped by ions; a second insulating layer formed on the active layer; a first gate electrode formed on the second insulating layer; a third insulating layer formed on the first gate electrode; a second gate electrode formed on the third insulating layer; a fourth insulating layer formed on the second gate electrode; a second source/drain electrode formed on the fourth insulating layer; a first via hole, a second via hole, and part of the second source/drain electrode connects to the doped region through the first via hole, another part of the second source/drain electrode connects to the first source/drain electrode through the second via hole; and a third via hole penetrating the fourth insulating layer, the third insulating layer, the second insulating layer, a barrier layer, and part of a flexible substrate thin film.

In one aspect of the present invention, the first via hole penetrates the fourth insulting layer, the third insulating layer, and the second insulating layer, and the second via hole penetrates the fourth insulting layer, the third insulating layer, the second insulating layer, and the first insulating layer.

In another aspect of the present invention, between the substrate and the first source/drain electrode, the array substrate further comprises a flexible substrate thin film layer formed on the substrate; and a barrier layer formed on the flexible substrate thin film layer.

In another aspect of the present invention, the third via hole is located on a bending area of a display panel and is filled with an organic insulating layer material.

The present invention further provides a manufacturing method of the array substrate, wherein the manufacturing method comprises providing a substrate, and forming a first source/drain electrode on the substrate; forming a first insulating layer and an active layer on the first source/drain electrode in order; wherein the active layer comprises a doped region; forming a second insulating layer and a first gate electrode on the active layer; forming a third insulating layer and a second gate electrode on the first gate electrode; forming a fourth insulating layer on the second gate electrode; forming a first via hole and a second via hole on the array substrate; and forming a second source/drain electrode on the fourth insulating layer, part of the second source/drain electrode connects to the doped region, and another part of the second source/drain electrode connects to the first source/drain electrode.

In another aspect of the present invention, the first via hole penetrates the fourth insulting layer, the third insulating layer, and the second insulating layer, and the second via hole penetrates the fourth insulting layer, the third insulating layer, and the second insulating layer.

In another aspect of the present invention, prior to forming the first source/drain electrode, the manufacturing method further comprises forming a flexible substrate thin film layer on the substrate; and forming a barrier layer on the flexible substrate thin film layer.

In another aspect of the present invention, a third via hole is formed on the array substrate; and wherein the third via hole penetrates the fourth insulating layer, the third insulating layer, the second insulating layer, a barrier layer, and part of a flexible substrate thin film.

In another aspect of the present invention, the third via hole is located on a bending area of a display panel and is filled with an organic insulating layer material.

The present invention further provides an array substrate, comprising a substrate; a first source/drain electrode formed on the substrate; a first insulating layer formed on the first source/drain electrode; an active layer formed on the first insulating layer, the active layer comprising a doped region doped by ions; a second insulating layer formed on the active layer; a first gate electrode formed on the second insulating layer; a third insulating layer formed on the first gate electrode; a second gate electrode formed on the third insulating layer; a fourth insulating layer formed on the second gate electrode; a second source/drain electrode formed on the fourth insulating layer; and a first via hole, a second via hole, a third via hole, and part of the second source/drain electrode connects to the doped region through the first via hole, and another part of the second source/drain electrode connects to the first source/drain electrode through the second via hole.

In another aspect of the present invention, the first via hole penetrates the fourth insulting layer, the third insulating layer, and the second insulating layer, and the second via hole penetrates the fourth insulting layer, the third insulating layer, the second insulating layer, and the first insulating layer.

In another aspect of the present invention, between the substrate and the first source/drain electrode, the array substrate further comprises: a flexible substrate thin film layer formed on the substrate; and a barrier layer formed on the flexible substrate thin film layer.

In another aspect of the present invention, the third via hole is located on a bending area of a display panel and is filled with an organic insulating layer material.

The present invention has advantages as follows: the present invention utilizes the first source/drain electrode and the second source/drain electrode disposed on the array substrate to connect with each other through the first via hole, thereby to overcome the technical problem of signal delay resulted from narrow configuration of lower frames of a display panel, and to ensure normal display of a flexible display device.

DESCRIPTION OF PREFERRED EMBODIMENTS

The following embodiments are referring to the accompanying drawings for exemplifying specific implementable embodiments of the present disclosure. Furthermore, directional terms described by the present disclosure, such as upper, lower, front, back, left, right, inner, outer, side, etc., are only directions by referring to the accompanying drawings, and thus the used directional terms are used to describe and understand the present disclosure, but the present disclosure is not limited thereto. In the drawings, elements with similar structures are labeled with like reference numerals.

Figure 1:
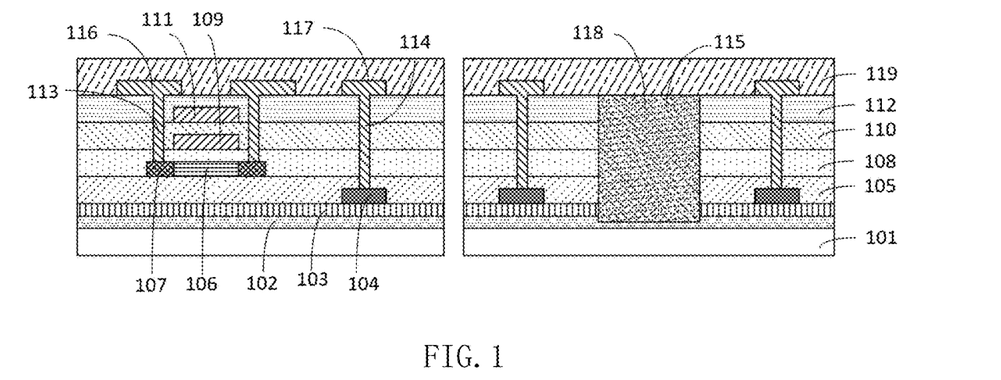
FIG. 1 is a layer structure view of an array substrate of the present invention.

FIG. 1 is a layer structure view of an array substrate of the present invention. The array substrate comprises a substrate 101 of which raw material can be a glass substrate, a quartz substrate, and a resign substrate.

A flexible substrate thin film layer 102 is formed on the substrate 101. Preferably, the flexible substrate thin film layer 102 is a polyimide thin film functioning as a substrate of a flexible display panel. The flexible substrate thin film layer 102 has a thickness of 10-20 um. The polyimide thin film is known as a thin film insulating material having the best performance in the world, and has higher tensile strength. The polyimide thin film is formed by film formation through polycondensation and casting of pyromellitic dianhydride and diaminodiphenyl ether in high polarity solvent, and then has undergone amination.

The barrier layer 103 is formed on the flexible substrate thin film layer. The barrier layer 103 is mainly utilized to stop water oxygen from entering the flexible substrate thin film layer 102, thereby causing flexible material to lose its original efficacy.

A first source/drain electrode 104 is formed on the barrier layer 103. The first source/drain electrode 104 is generally made of metallic material of molybdenum, aluminum, aluminum-nickel alloy, molybdenum-tungsten alloy, chromium, or copper and so on, or a composition made up of the preceding metallic material. In the present embodiment, the first source/drain electrode 104 is preferably made of titanium-aluminum alloy and has a thickness of 200-1000 nm.

A first photoresist layer is formed on a metal layer of the first source/drain electrode 104 through a first mask process. The first photoresist layer is exposed by a mask (not shown) and is subjected to development and composition process of first etching, so that the metal layer forms the first source/drain electrode 104 of the array substrate as shown in FIG. 4C.

A first insulating layer 105 is formed on the first source/drain electrode 104. In this embodiment, the first insulating layer 105 is exemplified by a buffering layer.

An active layer 106 is formed on the first insulting layer 105 and is made up of polycrystalline silicon. Preferably, the active layer 106 has a thickness of 200-500 nm.

A second photoresist layer (not shown) is formed on an active layer thin film of the active layer 106 through a first mask process. The second photoresist layer is exposed by a mask (not shown) and is subjected to development and composition process of second etching; next, the second photoresist layer is utilized as a barrier, so that ion implantation is capable of being performed on the active layer 106 being patterned to form a doped region 107, and the second photoresist layer is stripped off to form a pattern as shown in FIG. 1.

A second insulating layer 108 is formed on the active layer 106. In this embodiment, the second insulating layer 108 is exemplified by a gate insulating layer, which covers the active layer 106. The gate insulting layer is mainly utilized to isolate the active layer 106 from other metal layers. Preferably, the second insulating layer 108 has a thickness of 50-200 nm, and the gate insulating layer is generally made of silicon nitride, or both silicon oxide and silicon oxynitride.

A first gate electrode 109 is formed on the second insulating layer 108. The first gate electrode 109 is generally made of metallic material of molybdenum, aluminum, aluminum-nickel alloy, molybdenum-tungsten alloy, chromium, or copper and so on, or a composition made up of the preceding metallic material. In the present embodiment, the first gate electrode 109 is preferably made of molybdenum and has a thickness of 150-250 nm.

A third photoresist layer is formed on a metal layer of the first gate electrode 109 through a third mask process. The third photoresist layer is exposed by a mask (not shown) and is subjected to development and composition process of third etching, so that the metal layer forms the first gate electrode 109 of the array substrate.

The third insulating layer 110 is formed on the first gate electrode 109. In this embodiment, the third insulating layer 110 is exemplified by an interlayer dielectric layer, which covers the first gate electrode 109. The interlayer dielectric layer is mainly utilized to separate the first gate electrode 109 and a second gate electrode 111. Preferably, the third insulating layer 110 has a thickness of 50-200 nm.

The second gate electrode 111 is formed on the third insulating layer 110. The second gate electrode 111 is made of metal same as that of the first gate electrode 109 and generally is molybdenum, aluminum, aluminum-nickel alloy, molybdenum-tungsten alloy, chromium, or copper and so on, or a composition made up of the preceding metallic material. In this embodiment, the second gate electrode 111 is preferably made of molybdenum and has a thickness of 150-250 nm.

A fourth photoresist layer is formed on a metal layer of the second gate electrode 111 through a fourth mask process. The fourth photoresist layer is exposed by a mask (not shown) and is subjected to development and composition process of fourth etching, so that the metal layer forms the second gate electrode 111 of the array substrate.

A fourth insulating layer 112 is formed on the second gate electrode 111. In this embodiment, the fourth insulating layer 112 is exemplified by an interlayer dielectric layer and has a thickness of 500-700 nm.

A second source/drain electrode is formed on the fourth insulating layer 112. The second source/drain electrode is made of metal same as that of the first source/drain electrode 104 and generally is molybdenum, aluminum, aluminum-nickel alloy, molybdenum-tungsten alloy, chromium, or copper and so on, or a composition made up of the preceding metallic material. In this embodiment, the second source/drain electrode is preferably made of titanium-aluminum alloy and has a thickness of 400-600 nm.

A fifth photoresist layer is formed on a metal layer of the second source/drain electrode through a fifth mask process. The fifth photoresist layer is exposed by a mask (not shown) and is subjected to development and composition process of fifth etching, so that the metal layer forms the second source/drain electrode of the array substrate.

Further, prior to forming the second source/drain electrode, a first via hole 113, a second via hole 114, and a third via hole 115 are formed on a thin film structure of the array substrate through the etching process.

As shown in FIG. 1, the second source/drain electrode comprises a first part 116 and a second part 117 of the second source/drain electrode. The first part 116 of the second source/drain electrode connects the doped region 107 of the active layer 106 through the first via hole 113. The second part 117 of the second source/drain electrode connects the first source/drain electrode 104 through the second via hole 114.

The first via hole 113 penetrates the fourth insulating layer 112, the third insulating layer 110, the second insulating layer 108. The second via hole 114 penetrates the fourth insulating layer 112, the third insulating layer 110, the second insulating layer 108, and part of the first insulating layer 105.

Furthermore, the third via hole 115 penetrates the fourth insulating layer 112, the third insulating layer 110, the second insulating layer 108, the first insulting layer 105, the barrier layer 103, and part of the flexible substrate thin film layer 102, wherein the third via hole 115 is located at a bending area of a display panel and is filled with an organic insulating layer material, thereby to form a flexible layer 118.

Moreover, the array substrate further comprises a flat layer 119 and other film structure in association with organic light emitting diodes (OLEDs).

Figure 2:
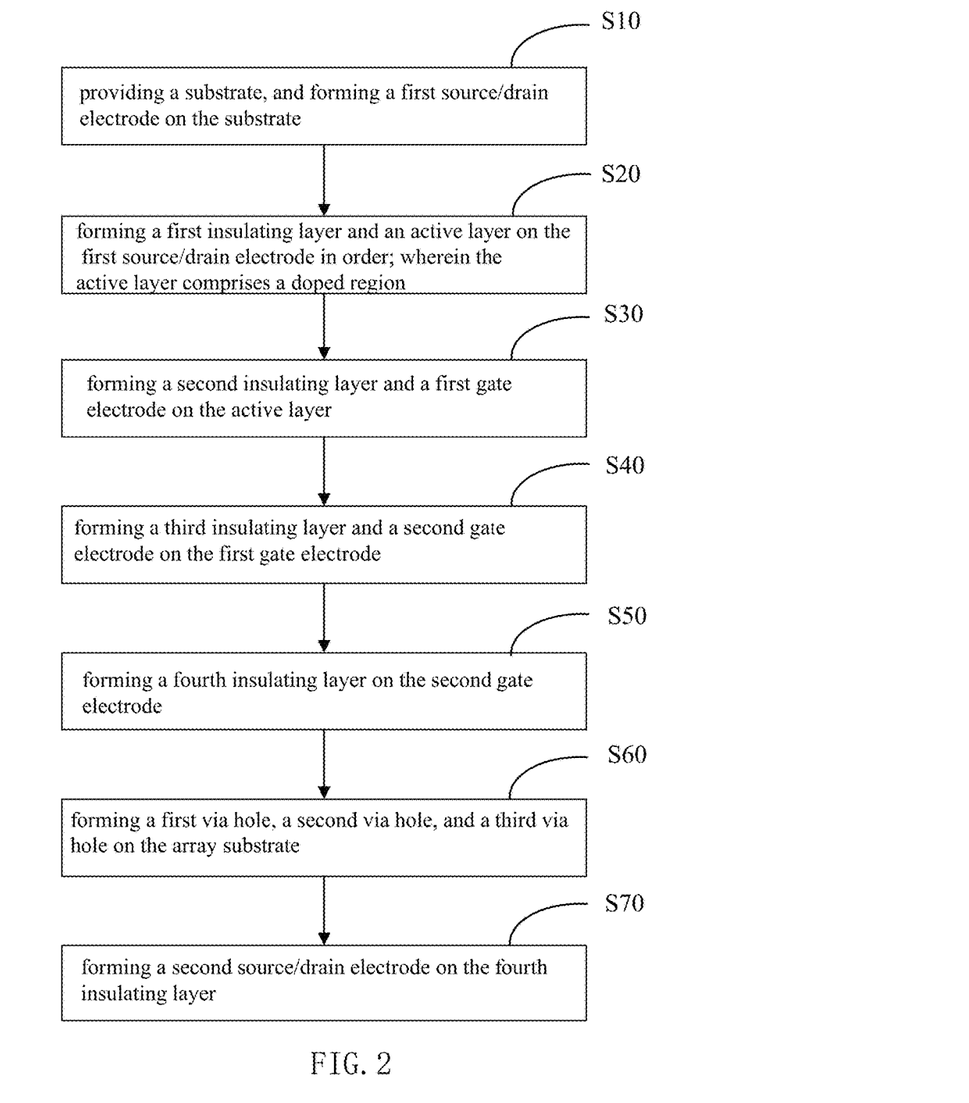
FIG. 2 is a flowchart of a manufacturing method of the array substrate of the present invention.
Figure 3A:
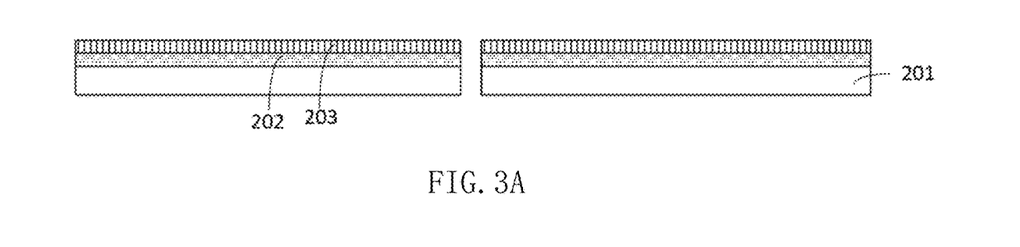
FIGS. 3A-3I are process views of the manufacturing method of the array substrate of the present invention.

FIG. 2 is a flowchart of a manufacturing method of the array substrate of the present invention, wherein the manufacturing method comprises steps as follows:

S10: provide a substrate and form a first source/drain electrode 204 on the substrate. The step S10 specifically comprises:

S101: provide a substrate. As shown in FIG. 3, raw material of the substrate 201 can be one of glass substrate, a quartz substrate, and a resign substrate.

S102: form a flexible substrate thin film layer 202 on the substrate.

Form a flexible pad thin film layer on the substrate 201. Preferably, the flexible substrate thin film layer 202 is a polyimide thin film functioning as a substrate of a flexible display panel. The flexible substrate thin film layer 102 has a thickness of 10-20 um. The polyimide thin film is known as a thin film insulating material having the best performance in the world, and has higher tensile strength. The polyimide thin film is formed by film formation through polycondensation and casting of pyromellitic dianhydride and diaminodiphenyl ether in high polarity solvent, and then has undergone amination.

S103: form a barrier layer 203 on the flexible substrate thin film layer 202.

Figure 3B:
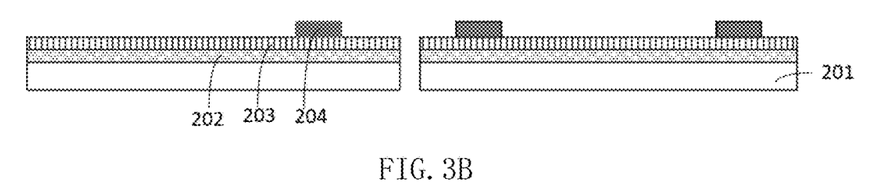

S104: form a first source/drain electrode 204 on the barrier layer 203. As shown in FIG. 3B, in this step, the first source/drain electrode 204 is formed on the barrier layer 203. The first source/drain electrode 204 generally is made of metallic material of molybdenum, aluminum, aluminum-nickel alloy, molybdenum-tungsten alloy, chromium, or copper and so on, or a composition made up of the preceding metallic material. In the present embodiment, the first source/drain electrode 204 is preferably made of titanium-aluminum alloy and has a thickness of 200-1000 nm.

A first photoresist layer is formed on a metal layer of the first source/drain electrode 204 through a first mask process. The first photoresist layer is exposed by a mask (not shown) and is subjected to development and composition process of first etching, so that the metal layer forms the first source/drain electrode 204 of the array substrate as shown in FIG. 3B.

Figure 3C:
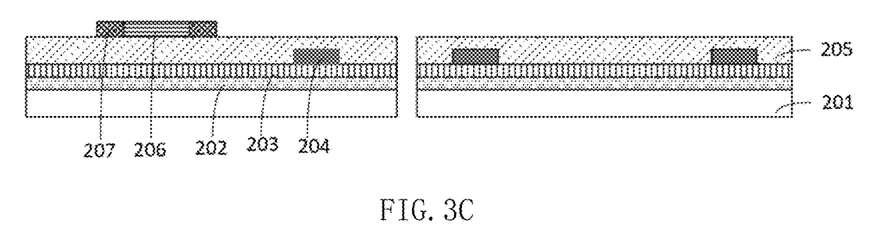

S20: form a first insulating layer 205 and an active layer 206 on the first source/drain electrode 204 in order. As shown in FIG. 3C, in this step, first, form the first insulating layer 205 on the first source/drain electrode 204. In this embodiment, the first insulating layer 25 is exemplified by a buffering layer.

Second, form the active layer 206 on the first insulting layer 205. The active layer 206 is made up of polycrystalline silicon. Preferably, the active layer 106 has a thickness of 200-500 nm.

Perform a second mask process on the active layer 206 and form a second photoresist layer (not shown) thereon. The second photoresist layer is exposed by a mask (not shown) and is subjected to development and composition process of second etching; next, the second photoresist layer is utilized as a barrier, so that ion implantation is capable of being performed on the active layer 106 being patterned to form a doped region 207, and the second photoresist layer is stripped off to form a pattern as shown in FIG. 3C. Furthermore, a barrier material used for ion implantation is not limited by the second photoresist layer disclosed in this embodiment.

Figure 3D:
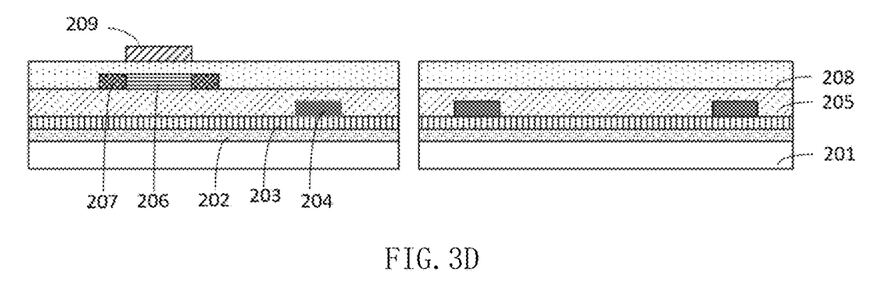

S30: form a second insulating layer 208 and a first gate electrode 209 on the active layer 206. As shown in FIG. 3D, in this step, the second insulating layer 208 is formed on the active layer 206. In this embodiment, the second insulating layer 208 is exemplified by a gate insulating layer, which covers the active layer 206. The gate insulting layer is mainly utilized to isolate the active layer 206 from other metal layers. Preferably, the second insulating layer 208 has a thickness of 50-200 nm, and the gate insulating layer is generally made of silicon nitride, or both silicon oxide and silicon oxynitride.

Next, a second gate electrode 209 is formed on the second insulating layer 208. The first gate electrode 209 is generally made of metallic material of molybdenum, aluminum, aluminum-nickel alloy, molybdenum-tungsten alloy, chromium, or copper and so on, or a composition made up of the preceding metallic material. In the present embodiment, the first gate electrode 209 is preferably made of molybdenum and has a thickness of 150-250 nm.

In the above-mentioned step that a third mask process is carried out on a metal layer of the first gate electrode 209 to form a third photoresist layer on the metal layer. The third photoresist layer is exposed by a mask (not shown) and is subjected to development and composition process of third etching, so that the metal layer forms the first gate electrode 209 of the array substrate.

Figure 3E:
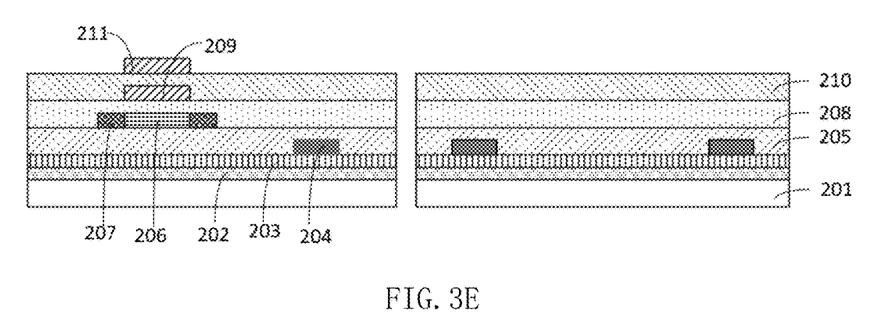

S40: form a third insulating layer 210 and a second gate electrode 211 on the first gate electrode 209.

As shown in FIG. 3E, in this step, a third insulating layer 210 is formed on the first gate electrode 209. In this embodiment, the second insulating layer 208 is exemplified by an interlayer dielectric layer, which covers the first gate electrode 209. The interlayer dielectric layer is mainly utilized to separate the first gate electrode 209 and a second gate electrode 211. Preferably, the third insulating layer 210 has a thickness of 50-200 nm.

Next, form the second gate electrode 211 on the third insulating layer 210. The second gate electrode 211 is made of metal same as that of the first gate electrode 209 and generally is molybdenum, aluminum, aluminum-nickel alloy, molybdenum-tungsten alloy, chromium, or copper and so on, or a composition made up of the preceding metallic material. In this embodiment, the second gate electrode 211 is preferably made of molybdenum and has a thickness of 150-250 nm.

In the above-mentioned step that a fourth mask process is carried out on a metal layer of the second gate electrode 211 to form a fourth photoresist layer on the metal layer. The fourth photoresist layer is exposed by a mask (not shown) and is subjected to development and composition process of fourth etching, so that the metal layer forms the second gate electrode 211 of the array substrate.

Figure 3F:
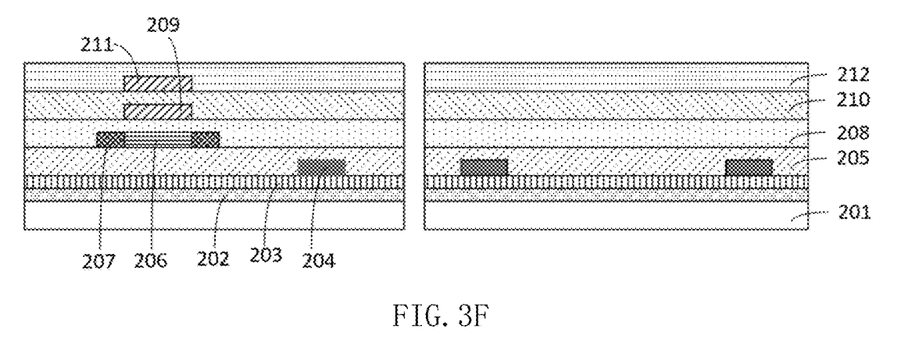

S50: form a fourth insulating layer 212 on the second gate electrode 211. As shown in FIG. 3F, in this step, the fourth insulating layer 212 is formed on the second gate electrode 211. In this embodiment, the fourth insulating layer 212 is exemplified by an interlayer dielectric layer and has a thickness of 500-700 nm.

Figure 3G:
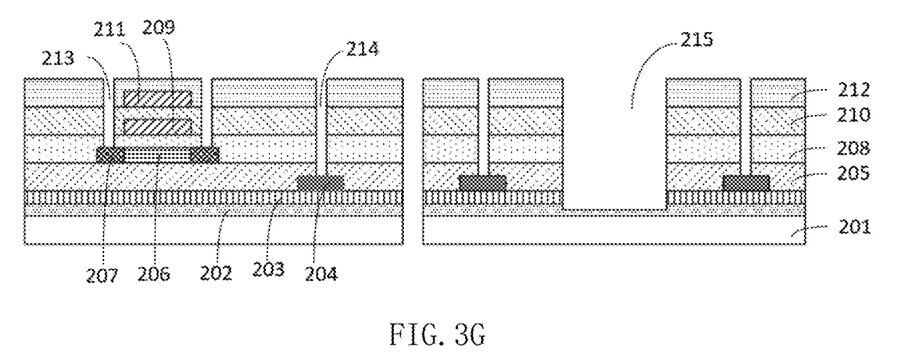

S60: form a first via hole 213, a second via hole 214, and a third via hole 211 on the array substrate.

As shown in FIG. 3G, in this step, a plurality of the first via holes 213, the second via holes 214, and the third via hole 211 are formed on the thin film structure of the array substrate by means of etching process.

The first vial hole 213 penetrates the fourth insulating layer 212, the third insulating layer 210, and the second insulating layer 208. The second via hole 215 penetrates the fourth insulating layer 212, the third insulating layer 210, the second insulating layer 208, and part of the first insulating layer 205. The third via hole 215 penetrates the fourth insulating layer 212, the third insulating layer 210, the second insulating layer 208, the first insulating layer 205, the barrier layer 203, and part of the flexible substrate thin film layer 202.

Figure 3H:
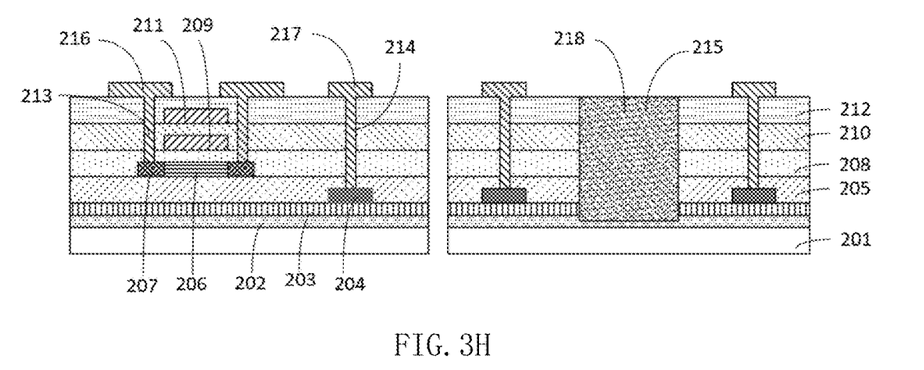

S70: form a second source/drain electrode on the fourth insulating layer 212. As shown in FIG. 3H, in this step, the second source/drain electrode is made of metal same as that of the first source/drain electrode 204 and generally is molybdenum, aluminum, aluminum-nickel alloy, molybdenum-tungsten alloy, chromium, or copper and so on, or a composition made up of the preceding metallic material. In this embodiment, the second source/drain electrode is preferably made of titanium-aluminum alloy and has a thickness of 400-600 nm.

A fifth photoresist layer is formed on a metal layer of the second source/drain electrode through a fifth mask process. The fifth photoresist layer is exposed by a mask (not shown) and is subjected to development and composition process of fifth etching, so that the metal layer forms the second source/drain electrode of the array substrate.

Furthermore, the second source/drain electrode comprises a first part 216 and a second part 217 of the second source/drain electrode. The first part 216 of the second source/drain electrode connects the doped region 207 of the active layer 206 through the first via hole 213. The second part 217 of the second source/drain electrode connects the first source/drain electrode 204 through the second via hole 214.

In this embodiment, the third via hole 215 is located at a bending area of a display panel and is filled with an organic insulating layer material, thereby to form a flexible layer 218.

Figure 3I:
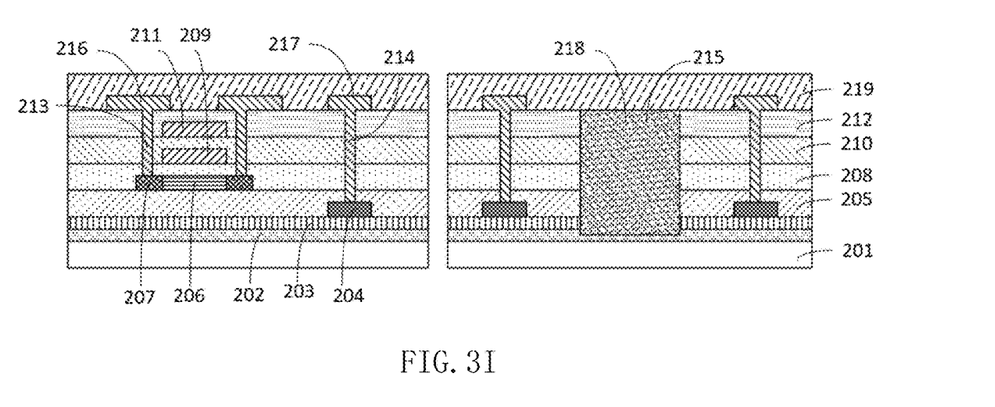

Finally, form a flat layer 219 on the second source/drain electrode as shown in FIG. 3I, to ensure a flat and straight configuration of the thin film structure, and then proceed to an OLED related process.

The present invention provides an array substrate and a manufacturing method thereof. The present invention utilizes the first source/drain electrode and the second source/drain electrode disposed on the array substrate to connect with each other through the first via hole, thereby to overcome the technical problem of signal delay resulted from narrow configuration of lower frames of a display panel, and to ensure normal display of a flexible display device.

It is understood that the invention may be embodied in other forms within the scope of the claims. Thus the present examples and embodiments are to be considered in all respects as illustrative, and not restrictive, of the invention defined by the claims.

What is claimed is:

1. An array substrate, comprising:
a substrate;
a first source/drain electrode formed on the substrate;
a first insulating layer formed on the first source/drain electrode;
an active layer formed on the first insulating layer, the active layer comprising a doped region doped by ions;
a second insulating layer formed on the active layer;
a first gate electrode formed on the second insulating layer;
a third insulating layer formed on the first gate electrode;
a second gate electrode formed on the third insulating layer;
a fourth insulating layer formed on the second gate electrode;
a second source/drain electrode formed on the fourth insulating layer;

a first via hole, a second via hole, wherein part of the second source/drain electrode connects to the doped region through the first via hole, and wherein another part of the second source/drain electrode connects to the first source/drain electrode through the second via hole; and a third via hole penetrating the fourth insulating layer, the third insulating layer, the second insulating layer, and the first insulating layer.

2. The array substrate of claim 1, wherein the first via hole penetrates the fourth insulting layer, the third insulating layer, and the second insulating layer.

3. The array substrate of claim 1, wherein between the substrate and the first source/drain electrode, the array substrate further comprises:
   a flexible substrate thin film layer formed on the substrate; and
   a barrier layer formed on the flexible substrate thin film layer.

4. The array substrate of claim 1, wherein the third via hole is located at a bending area of a display panel and is filled with an organic insulating layer material.

5. A manufacturing method of an array substrate, comprising:
   providing a substrate, and forming a first source/drain electrode on the substrate;
   forming a first insulating layer and an active layer on the first source/drain electrode in order, wherein the active layer comprises a doped region;
   forming a second insulating layer and a first gate electrode on the active layer;
   forming a third insulating layer and a second gate electrode on the first gate electrode;
   forming a fourth insulating layer on the second gate electrode;
   forming a first via hole and a second via hole on the array substrate; and
   forming a second source/drain electrode on the fourth insulating layer, part of the second source/drain electrode connects to the doped region, and another part of the second source/drain electrode connects to the first source/drain electrode.

6. The manufacturing method of claim 5, wherein the first via hole penetrates the fourth insulting layer, the third insulating layer, and the second insulating layer, and the second via hole penetrates the fourth insulting layer, the third insulating layer, and the second insulating layer.

7. The manufacturing method of claim 5, wherein prior to forming the first source/drain electrode, the manufacturing method further comprises:

forming a flexible substrate thin film layer on the substrate; and
forming a barrier layer on the flexible substrate thin film layer.

8. The manufacturing method of claim 7, wherein a third via hole is formed on the array substrate; and wherein the third via hole penetrates the fourth insulating layer, the third insulating layer, the second insulating layer, the first insulting layer, the barrier layer, and part of the flexible substrate thin film.

9. The manufacturing method of claim 8, wherein the third via hole is located at a bending area of a display panel and is filled with an organic insulating layer material.

10. An array substrate, comprising:
    a substrate;
    a first source/drain electrode formed on the substrate;
    a first insulating layer formed on the first source/drain electrode;
    an active layer formed on the first insulating layer, the active layer comprising a doped region doped by ions;
    a second insulating layer formed on the active layer;
    a first gate electrode formed on the second insulating layer;
    a third insulating layer formed on the first gate electrode;
    a second gate electrode formed on the third insulating layer;
    a fourth insulating layer formed on the second gate electrode;
    a second source/drain electrode formed on the fourth insulating layer; and
    a first via hole, a second via hole, a third via hole, and part of the second source/drain electrode connects to the doped region through the first via hole, and another part of the second source/drain electrode connects to the first source/drain electrode through the second via hole.

11. The array substrate of claim 10, wherein the first via hole penetrates the fourth insulting layer, the third insulating layer, and the second insulating layer.

12. The array substrate of claim 10, wherein between the substrate and the first source/drain electrode, the array substrate further comprises:
    a flexible substrate thin film layer formed on the substrate; and
    a barrier layer formed on the flexible substrate thin film layer.

13. The array substrate of claim 10, wherein the third via hole is located at a bending area of a display panel and is filled with an organic insulating layer material.

* * * * *

UNITED STATES PATENT AND TRADEMARK OFFICE
CERTIFICATE OF CORRECTION

PATENT NO. : 10,453,872 B1  
APPLICATION NO. : 16/085599  
DATED : October 22, 2019  
INVENTOR(S) : Xing Wang It is certified that error appears in the above-identified patent and that said Letters Patent is hereby corrected as shown below:

On the Title Page

Assignee (73) should be corrected as follows:
Change:
--WUHAN CHINA STAR OPTOELECTRONICS SEMICONDUCTOR DISPLAY TECHNOLOGIY CO., LTD., Wuhan (CN)--
To:
"WUHAN CHINA STAR OPTOELECTRONICS SEMICONDUCTOR DISPLAY TECHNOLOGY CO., LTD., Wuhan (CN)"

Signed and Sealed this  
Fourth Day of February, 2020

Andrei Iancu  
*Director of the United States Patent and Trademark Office*